United States Patent
Hung et al.

(10) Patent No.: US 9,917,189 B2
(45) Date of Patent: Mar. 13, 2018

(54) METHOD FOR DETECTING PRESENCE AND LOCATION OF DEFECTS IN A SUBSTRATE

(71) Applicant: Taiwan Semiconductor Manufacturing Company, Ltd., Hsin-Chu (TW)

(72) Inventors: Shih-Wei Hung, Hsin-Chu (TW); Chien-Feng Lin, Zhudong Township (TW); Zheng-Yang Pan, Zhubei (TW); Shu Kuan, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 151 days.

(21) Appl. No.: 14/814,959

(22) Filed: Jul. 31, 2015

(65) Prior Publication Data
US 2017/0033218 A1    Feb. 2, 2017

(51) Int. Cl.
*H01L 29/66* (2006.01)
*H01L 29/78* (2006.01)
*H01L 21/66* (2006.01)

(52) U.S. Cl.
CPC ......... *H01L 29/7848* (2013.01); *H01L 22/12* (2013.01); *H01L 29/6656* (2013.01); *H01L 29/66636* (2013.01); *H01L 29/66795* (2013.01); *H01L 29/7851* (2013.01); *H01L 29/66659* (2013.01)

(58) Field of Classification Search
CPC ...................................................... H01L 29/66
See application file for complete search history.

(56) References Cited

U.S. PATENT DOCUMENTS

| | | |
|---|---|---|
| 5,444,265 A | 8/1995 | Hamilton |
| 6,038,019 A | 3/2000 | Chang et al. |
| 6,654,109 B2 | 11/2003 | Li et al. |
| 7,220,978 B2 | 5/2007 | Ma et al. |
| 7,494,856 B2 | 2/2009 | Zhang et al. |
| 8,487,378 B2 | 7/2013 | Goto et al. |
| 8,729,634 B2 | 5/2014 | Shen et al. |
| 8,826,213 B1 | 9/2014 | Ho et al. |
| 8,887,106 B2 | 11/2014 | Ho et al. |
| 9,508,611 B2 | 11/2016 | Kimura et al. |
| 2014/0282326 A1 | 9/2014 | Chen et al. |

FOREIGN PATENT DOCUMENTS

| | | |
|---|---|---|
| JP | 2015129057 A | 7/2015 |
| KR | 1020080108498 A | 12/2008 |
| WO | 2015022739 A1 | 2/2015 |

*Primary Examiner* — Marvin Payen
(74) *Attorney, Agent, or Firm* — Slater Matsil, LLP

(57) ABSTRACT

A method for detecting the presence and location of defects over a substrate is disclosed. In an embodiment, the method may include: forming a semiconductor material in a plurality of openings in a reference wafer using an epitaxial growth process; performing one or more measurements on the reference wafer to obtain a baseline signal; forming a plurality of gate stacks and stressor regions in a plurality of substrates; after forming the plurality of gate stacks, forming the semiconductor material in a plurality of openings in a batch wafer; performing the one or more measurements on the batch wafer to obtain a batch signal; comparing the batch signal to the baseline signal; and determining whether a defect in present in the plurality of substrates based on the comparison.

20 Claims, 13 Drawing Sheets

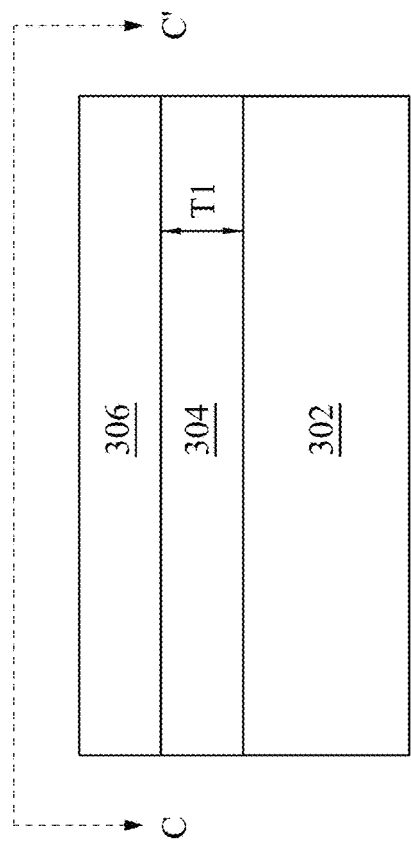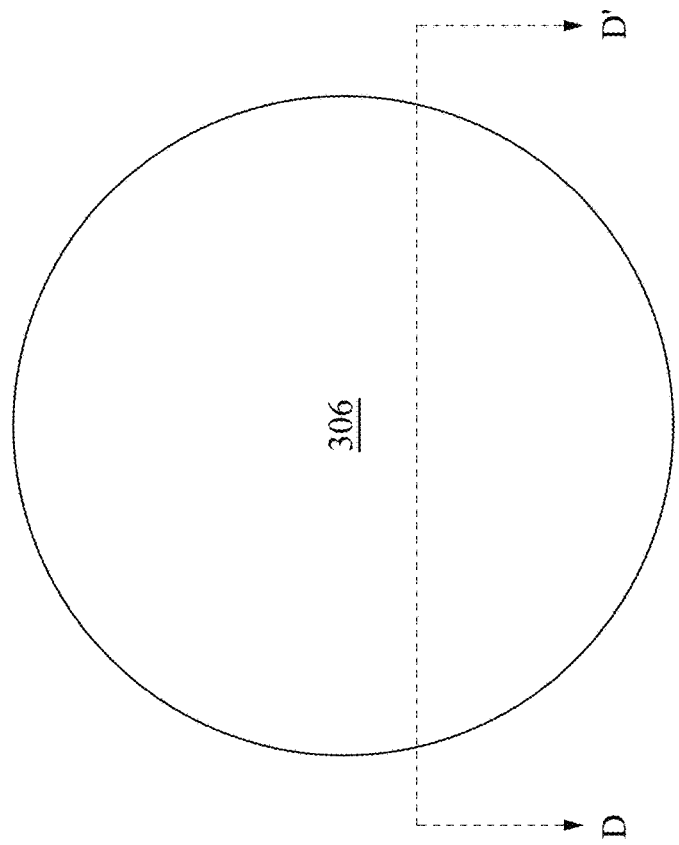
Figure 3A
Figure 4A

METHOD FOR DETECTING PRESENCE AND LOCATION OF DEFECTS IN A SUBSTRATE

BACKGROUND

To enhance the performance of metal-oxide-semiconductor (MOS) devices, stress may be introduced in the channel regions of the MOS devices to improve carrier mobility. Generally, it is desirable to induce a tensile stress in the channel region of an n-type MOS ("NMOS") device in a source-to-drain direction, and to induce a compressive stress in the channel region of a p-type MOS ("PMOS") device in a source-to-drain direction.

A commonly used method for applying stress to the channel region of a device is growing stressor regions in the source and drain regions of the device. As an example, stressor regions in a PMOS device may comprise SiGe, while stressor regions in an NMOS device may comprise SiP. Growing stressor regions in the source and drain regions of the device can include the steps of forming a gate stack on a silicon substrate, forming spacers on sidewalls of the gate stack, forming recesses in the silicon substrate and adjacent the gate spacers, and epitaxially growing stressor regions in the recesses using an epitaxial growth process. An annealing may also be performed. In a PMOS device, since SiGe has a greater lattice constant than silicon, it expands after annealing and applies a compressive stress to the channel region of the respective MOS device, which is located between a source SiGe stressor and a drain SiGe stressor. In an NMOS device, since SiP has a smaller lattice constant than silicon, it contracts after annealing and applies a tensile stress to the channel region of the respective MOS device, which is located between a source SiP stressor and a drain SiP stressor.

Atoms and/or molecules from a precursor of the epitaxial growth process may react with gate spacers of the gate stack. Such a reaction could cause defects, e.g., selectivity loss defects, on the gate spacers that are difficult to remove by typical cleaning processes. It may also be difficult to quickly and precisely detect such selectivity loss defects. Improved methods of detecting defects caused by the epitaxial growth process may be necessary.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A to 3D show cross-sectional views of a method of manufacturing a wafer, in accordance with an embodiment.

FIGS. 4A to 4D show top-down plan views of a method of manufacturing a wafer, in accordance with an embodiment.

DETAILED DESCRIPTION

Figure 1A:
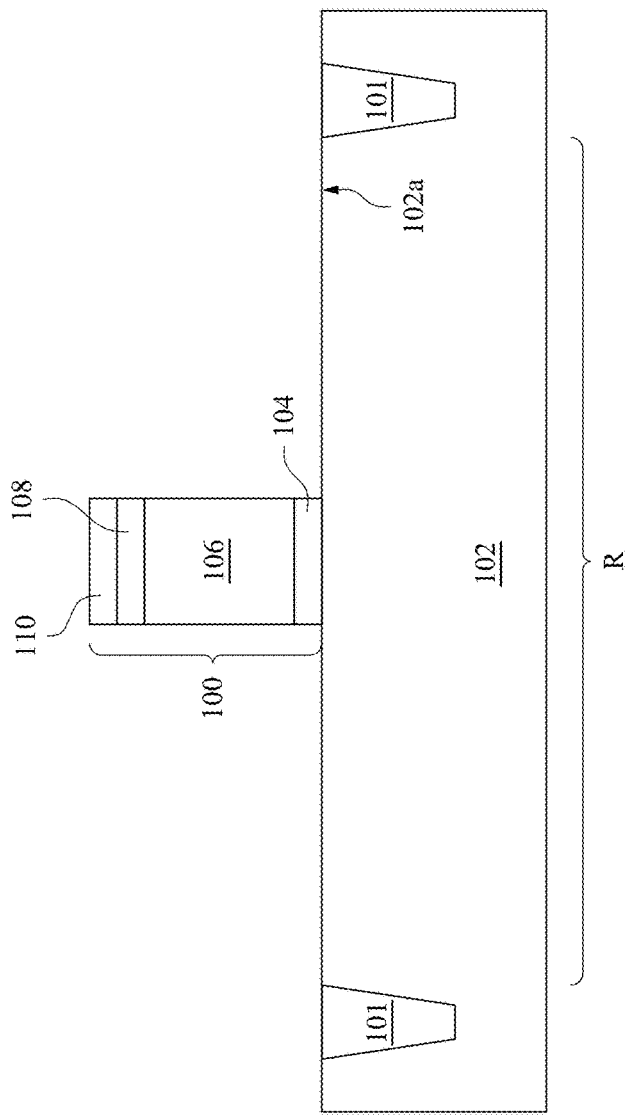
FIGS. 1A to 1F show cross-sectional views of a method of forming stressor regions in source and drain regions of a semiconductor device, in accordance with an embodiment.

The following disclosure provides many different embodiments, or examples, for implementing different features of the provided subject matter. Specific examples of components and stacks are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

To enhance the performance of metal-oxide-semiconductor (MOS) devices, stress may be introduced in the channel regions of the MOS devices to improve carrier mobility. Generally, it is desirable to induce a tensile stress in the channel region of an n-type MOS ("NMOS") device in a source-to-drain direction, and to induce a compressive stress in the channel region of a p-type MOS ("PMOS") device in a source-to-drain direction. A method for applying stress to the channel regions of the PMOS device or the NMOS device is growing stressor regions (comprising a doped compound semiconductor material) in the source and drain regions of the PMOS device or the NMOS device.

FIGS. 1A to 1F show cross-sectional views of a method of forming stressor regions in source and drain regions of a semiconductor device (e.g. a PMOS device and/or an NMOS device), in accordance with one or more embodiments. FIG. 1A illustrates a gate stack 100 formed over a substrate 102. The gate stack 100 comprises a gate dielectric layer 104, a gate electrode 106 over the gate dielectric layer 104, an anti-reflection coating (ARC) 108 over the gate electrode 106, and a hardmask 110 over the ARC 108. In an embodiment, the gate stack 100 shown in the example of FIG. 1 can be a gate stack for an n-type device, such as an NMOS transistor, such as an n-type finFET. In another embodiment, the gate stack 100 shown in the example of FIG. 1 can be a gate stack for a p-type device, such as a PMOS transistor, such as a p-type finFET. Only one gate stack 100 is shown in the example of FIG. 1; however, in another embodiment, a plurality of gate stacks (e.g. tens of, hundreds of, or more gate stacks) may be formed over the substrate 102.

As shown in the example of FIG. 1A, the gate stack 100 may be formed in a region R of the substrate 102, which may have isolation regions 101 at lateral portions thereof. The isolation regions 101 may, as an example, define the region R of the substrate 102. The isolation regions 101 may be shallow trench isolation (STI) regions, in an embodiment. In an example where the gate stack 100 is a gate stack for an n-type device, the region R may be an NMOS region of the substrate 102. In another example where the gate stack 100 is a gate stack for a p-type device, the region R may be a PMOS region of the substrate 102.

The substrate 102 may be a bulk semiconductor substrate, a semiconductor-on-insulator (SOI) substrate, a multi-layered or gradient substrate, or the like, which may be doped (e.g., with a p-type or an n-type dopant) or undoped. The substrate 102 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. In some embodiments, the semiconductor material of the substrate 102 may include an elemental semiconductor such as silicon, germanium, or the like; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The gate dielectric layer 104 of the gate stack 100 may be formed over a major surface 102a of the substrate 102. The gate dielectric layer 104 can be any acceptable dielectric layer, such as silicon oxide, silicon nitride, the like, or a combination thereof. As another example, the gate dielectric layer 104 may comprise a high-k dielectric material having a k value greater than or equal to about 7. The gate dielectric layer 104 may be formed using any acceptable process, such as thermal oxidation, a spin process, a chemical vapor deposition (CVD), or the like.

The gate electrode 106 of the gate stack 100 can be any acceptable electrode layer, such as comprising polysilicon (e.g. doped polysilicon), metal, metal silicides, metal nitrides, combinations thereof, or the like. The gate electrode 106 can be formed over the gate dielectric layer 104 using any acceptable deposition process, such as a CVD, a plasma enhanced CVD (PECVD), or the like. The ARC 108 of the gate stack 100 can be any acceptable material, such as silicon oxide, silicon oxynitride, the like, or a combination thereof, and may be deposited by any acceptable deposition process, such as CVD, PECVD, or the like. The hardmask 110 of the gate stack 100 may be formed over the ARC 108. The hardmask 110 may be any acceptable masking layer, such as silicon nitride, silicon carbon nitride, the like, or a combination thereof. The hardmask 110 may be deposited by any acceptable deposition process, such as CVD, PECVD, or the like. The gate dielectric layer 104, the gate electrode 106, the ARC 108, and the hardmask 110 may then patterned into the gate stack 100, such as by using any acceptable photolithography and etching processes.

Figure 1B:
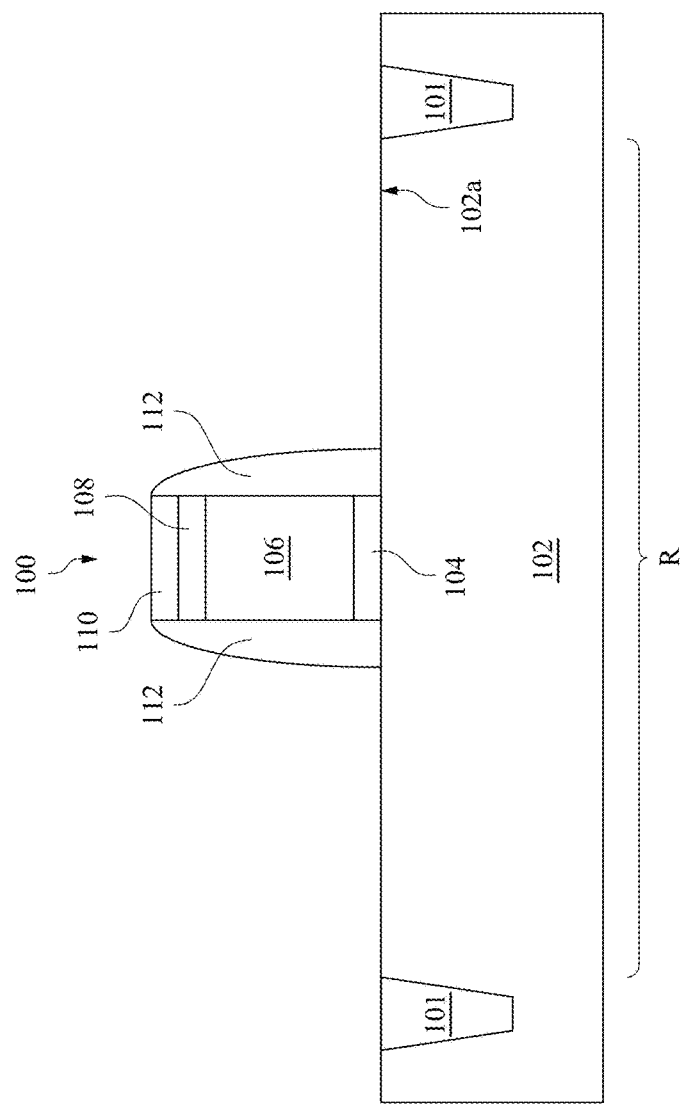

Referring to FIG. 1B, the process flow continues with the formation of first spacers 112 on opposing sidewalls of the gate stack 100. As an example, the first spacers 112 may be formed over opposing sidewalls of each of the gate dielectric layer 104, gate electrode 106, ARC 108, and hardmask 110.

The first spacers 112 may comprise a suitable dielectric material such as silicon oxide, although other dielectric materials such as silicon nitride, silicon oxynitride, or the like may also be used. The first spacers 112 shown in the example of FIG. 1B can be formed by a deposition process followed by a patterning process. The deposition process may include suitable processes, such as a CVD, plasma enhanced chemical vapor deposition (PECVD), low-pressure chemical vapor deposition (LPCVD), sub-atmospheric chemical vapor deposition (SACVD), or the like. The patterning process may be any acceptable photolithography and etching process.

Figure 1C:
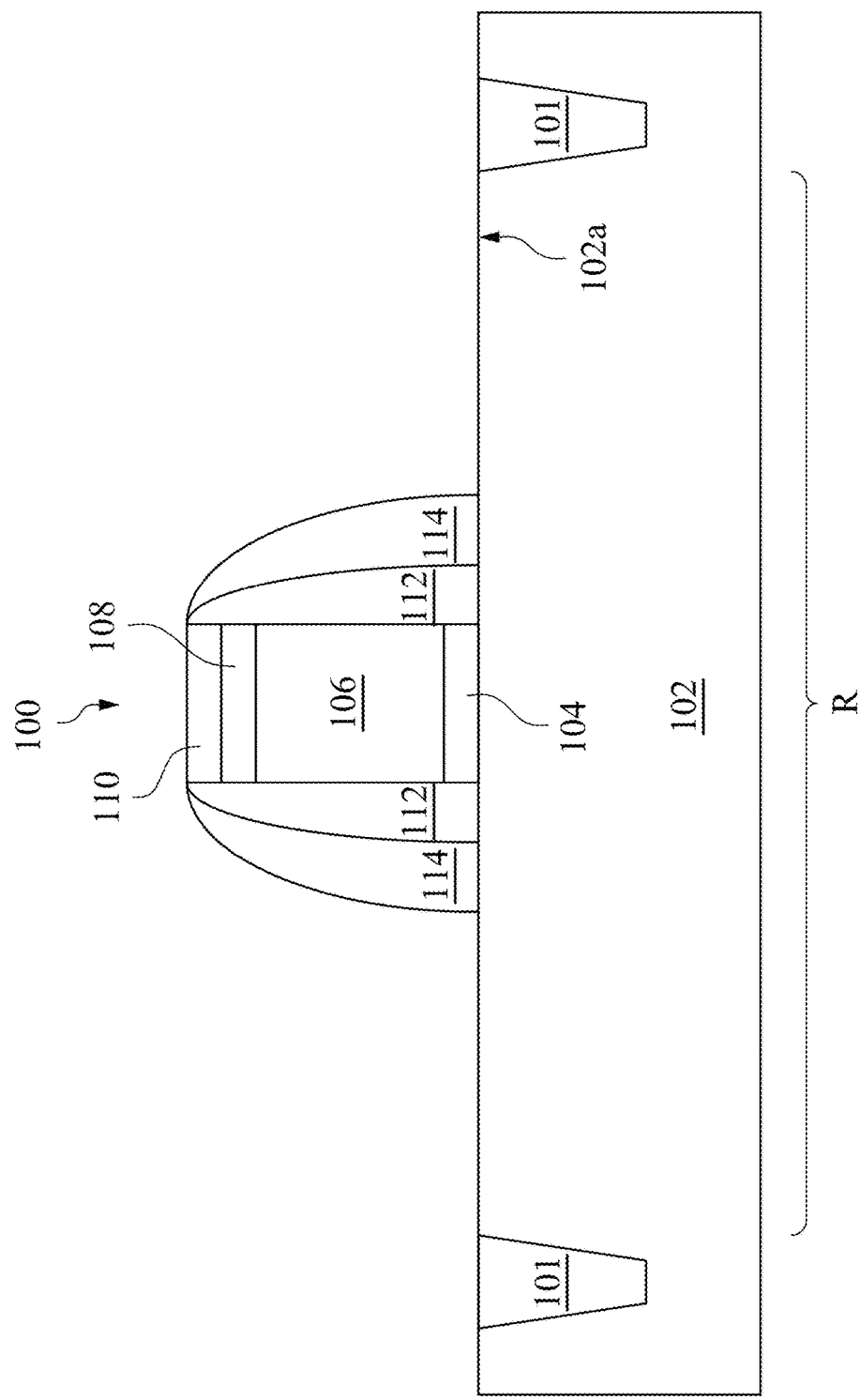

Referring to FIG. 1C, offset spacers 114 may be formed over surfaces of the first spacers 112 facing away from the gate stack 100. The offset spacers 114 may comprise a dielectric material, such as silicon oxynitride (SiON), silicon nitride (SiN), or carbon-doped silicon nitride (SiCN), or carbon doped silicon oxyntride (SiOCN). The offset spacers 114 may be formed using similar processes described above in respect of the first spacers 112.

Figure 1D:
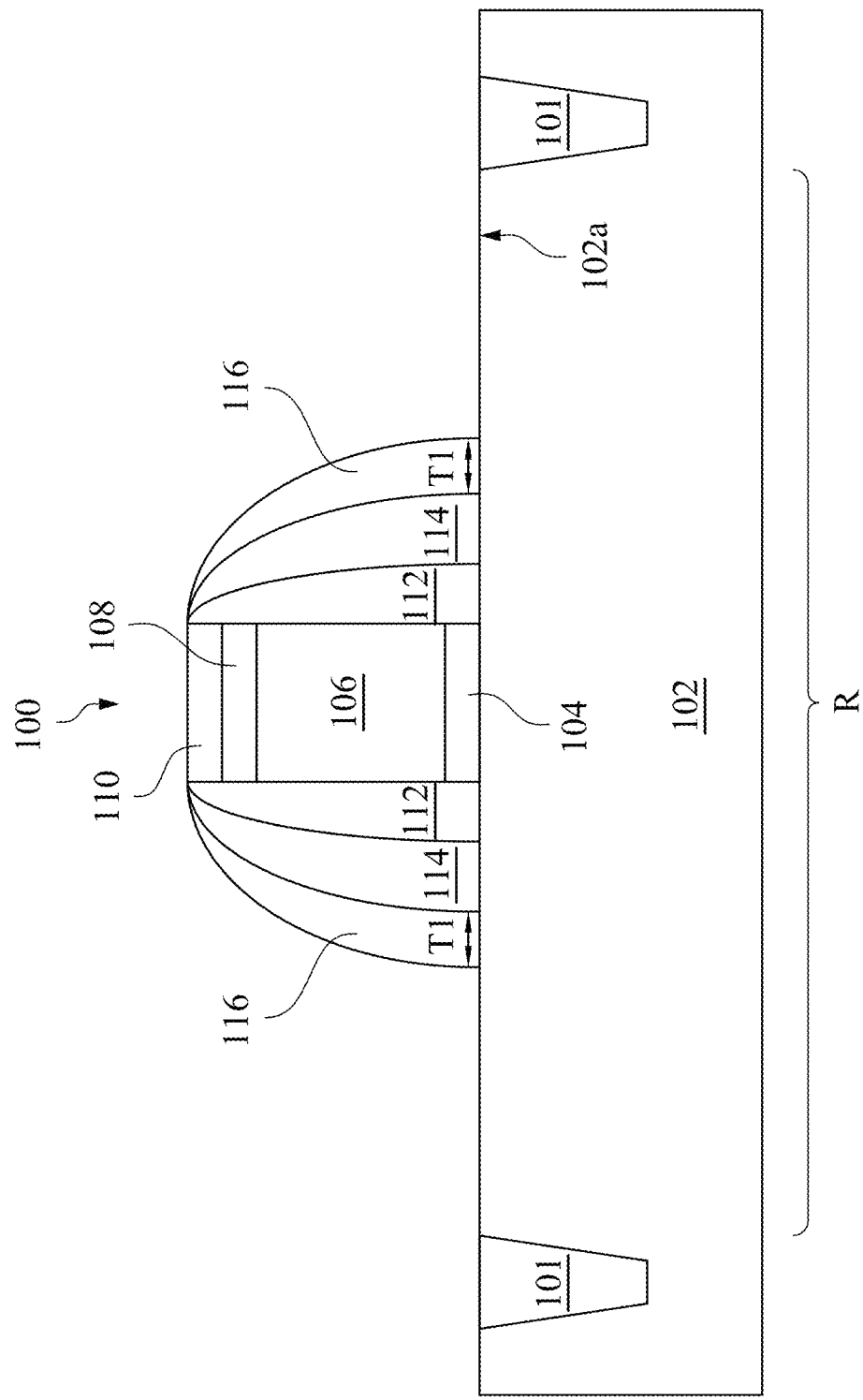

Referring to FIG. 1D, second spacers 116 may be formed over surfaces of the offset spacers 114 facing away from the gate stack 100. The second spacers 116 may comprise a dielectric material different from the material of the offset spacers 114 and/or the first spacers 112. As an example, the second spacers 116 may comprise a nitride-containing material. Examples of such materials include silicon oxynitride (SiON), silicon nitride (SiN), or carbon-doped silicon nitride (SiCN). Compared to the offset spacers 114 and the first spacers 112, the second spacers 116 may have a lower etch rate against etchants typically employed to etch the substrate 102, such as $H_3PO_4$ and HF. In other words, compared to the offset spacers 114 and the first spacers 112, the second spacers 116 may have a high degree of resistance to etchants that may be used to etch the substrate 102. In an embodiment, the second spacers 116 may be formed to have a thickness T1, which may be in a range from about 3 nanometers to about 50 nanometers (e.g. about 5 nanometers). As shown in the example of FIG. 1D, the thickness T1 may be measured at a region of the second spacers 116 proximal the substrate 102. As an example, the portion of the second spacers 116 contacting (e.g. physically contacting) the substrate 102 may have the thickness T1.

Following the formation of the second spacers 116, stressor regions may be formed in source and drain regions of the substrate 102. The stressor regions may be formed by initially forming recesses 118 on opposing sides of the gate stack 100 using the second spacers 116, the offset spacers 114, and the first spacers 112 as a mask (e.g. as shown in the example of FIG. 1E) and subsequently forming stressor regions 120 in the recesses 118 (e.g. as shown in the Example of FIG. 1F).

Figure 1E:
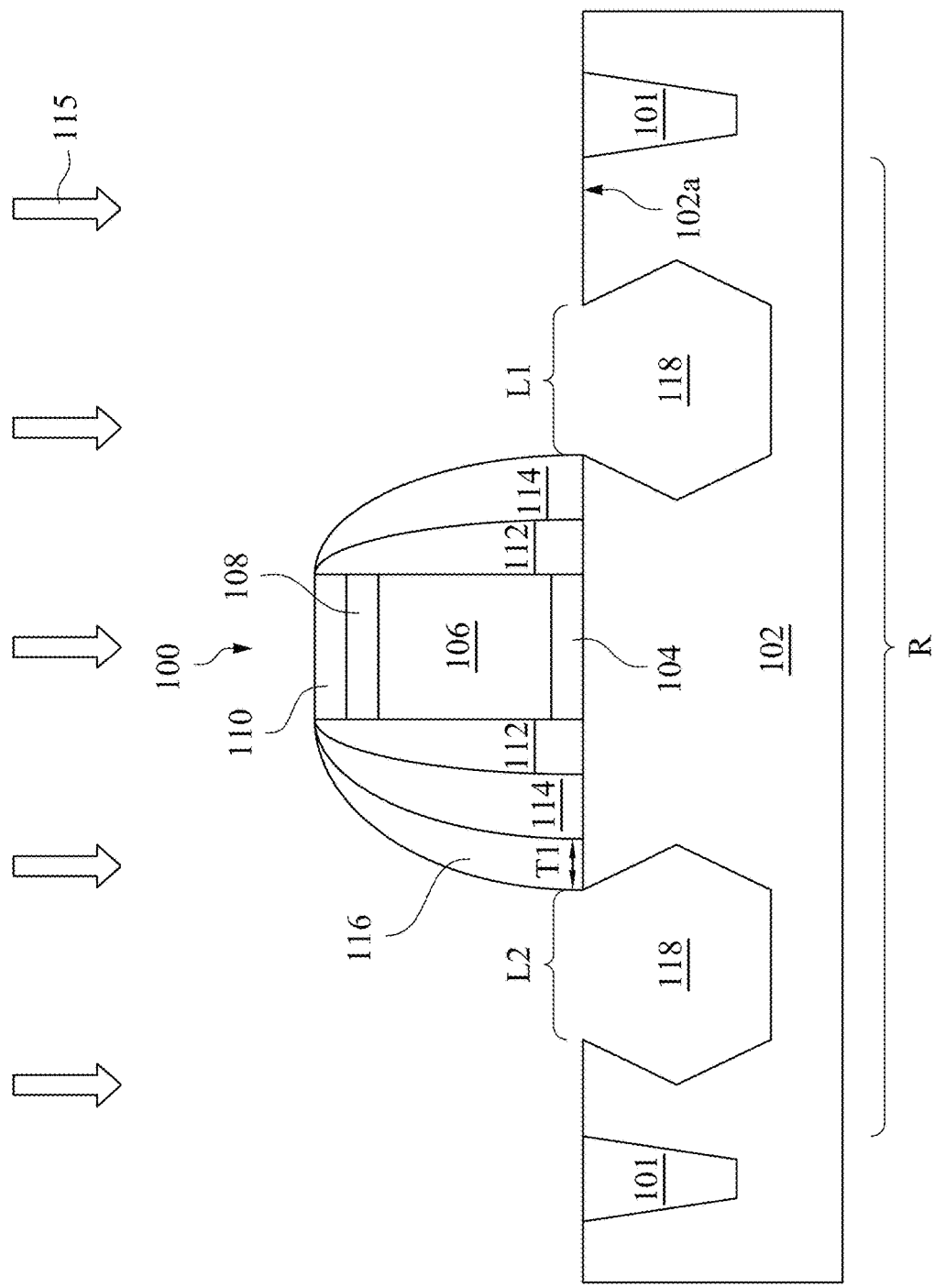
Figure 1F:
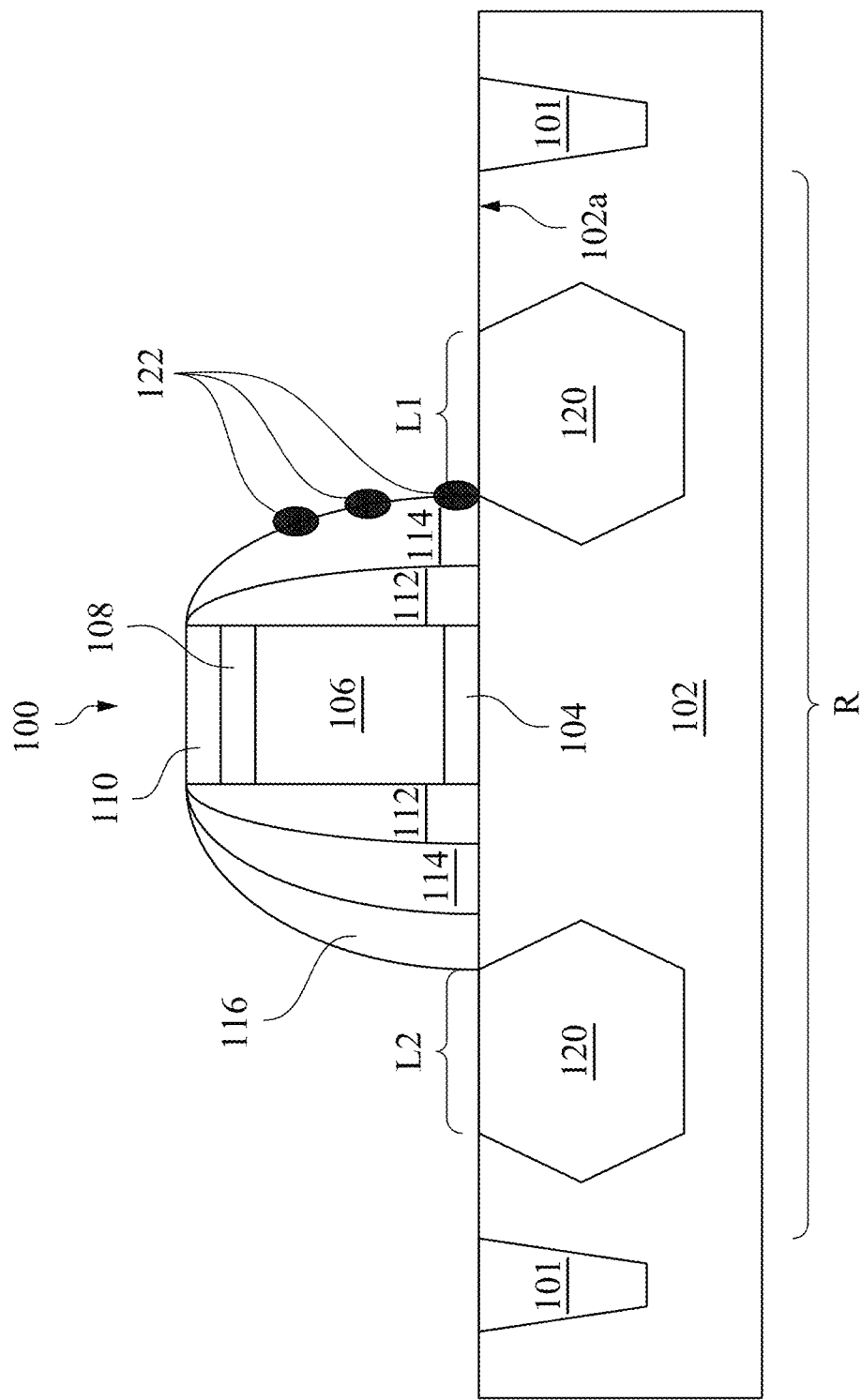

Referring to FIG. 1E, one or more etching processes 115 may be used to form the recesses 118. The one or more etching processes 115 may be isotropic etching process(es) including dry process(es) (such as a plasma etching process), wet etching process(es), or a combination of both. In some embodiments, the wet etching process used to form the recesses 118 may include the use of an etchant such as $H_3PO_4$, carbon tetrafluoride ($CF_4$), HF, tetramethylammonium hydroxide (TMAH), combinations thereof, or the like.

As shown in the example of FIG. 1E, the one or more etching processes 115 used to form the recesses 118 may have different etch rates at different positions along the substrate 102. In other words, there may be local variations in the etch rate of the one or more etching processes 115 used to form the recesses 118. The local variations in the etch rate of the one or more etching processes 115 may result in different degrees of etching of the second spacer 116 as a function of location along the substrate 102. In the example of FIG. 1E, the etch rate of the one or more etching processes 115 may be greater at the right side of the gate stack 100 compared to the left side of the gate stack 100. This may result in the second spacer 116 located to the right of the gate stack 100 being over-etched or removed, while the second spacer 116 located to the left of the gate stack 100 may be substantially unperturbed. As a consequence of the over-etching or removal of the second spacer 116 located near the right side of the gate stack 100, the offset spacer 114 located at the right side of the gate stack 100 may be exposed, as illustrated in FIG. 1E. Furthermore, as a consequence of the over-etching or removal of the second spacer 116 located near the right side of the gate stack 100, the recess 118 located near the right side of the gate stack 100 may be in closer proximity to the gate stack 100 compared to the recess 118 located near the left side of the gate stack 100.

The local variations in the etch rate of the one or more etching processes 115 may be a result of local variations in precursor flow rate, temperature, and pressure of the one or more etching processes used to form the recesses 118. Some of these local variations in precursor flow rate, temperature, and pressure may be caused by a drift in instrument calibration over time. As an example, the one or more etching processes 115 used to form the recesses 118 may be performed in a reaction chamber, which may have parts therein that may have calibrations that drift over time through repeated use of the reaction chamber in an inline manufacturing process. Other causes of the local variations in precursor flow rate, temperature, and pressure of the one or more etching processes used to form the recesses 118 may be inherent to the one or more etching processes 115 used to form the recesses 118. As an example, the degree of over-etching of the second spacer 116 may be inherently difficult to control with an isotropic wet etch processes. Furthermore, a wet etch process may exhibit a decrease in etch rate as reagent solutions are consumed. Since reagent solutions may be consumed at different rates at different locations of the substrate 102, the result may be local variations in the etch rate of the one or more etching processes used to form the recesses 118.

As shown in FIG. 1E, the recesses 118 may be formed in specific locations of the substrate 102. An open ratio may be a percentage of the substrate 102 in which the recesses 118 are formed. In an embodiment, the open ratio for an inline process that manufactures a PMOS device and/or an NMOS device may be in a range from about 7 percent to about 28 percent. In other words, recesses 118 may be formed in about 7 percent to about 28 percent of the substrate 102 and at specific locations of the substrate 102. For example, the recess 118 located to the right of the gate stack 100 may be formed in a first location L1 of the substrate 102, while the recess 118 located to the left of the gate stack 100 may be formed in a second location L2 of the substrate 102. The first location L1 and the second location L2 of the substrate 102 may be pre-determined locations based on the inline manufacturing process used.

Referring to FIG. 1F, the process flow continues with the formation of stressor regions 120 in the recesses 118. In some embodiments, the stressor regions 120 are formed by epitaxially growing a material in the recesses 118, such as by metal-organic CVD (MOCVD), molecular beam epitaxy (MBE), liquid phase epitaxy (LPE), vapor phase epitaxy (VPE), selective epitaxial growth (SEG), the like, or a combination thereof. The stressor regions 120 may comprise a semiconductor material. As an example, the stressor regions 120 may comprise SiP (e.g. in an example where an n-type device is manufactured) or SiGe (e.g. in an example where a p-type device is manufactured).

In an embodiment, the dopants are introduced into the semiconductor material of the stressor regions 120 as the stressor regions 120 are grown. The n-type dopants may be phosphorus, arsenic, or the like, and the p-type dopants may be boron, $BF_2$, or the like. As an example, during the epitaxial growth process of the stressor regions 120, precursors that comprise the desired dopants are placed in situ into the reaction vessel along with the precursor reactants for the semiconductor material of the stressor regions 120. As such, the dopants are introduced and incorporated into the semiconductor material of the stressor regions 120 to provide the stressor regions 120 the desired conductivity while the stressor regions 120 are grown.

Alternatively, in another embodiment, the dopants may be introduced into the semiconductor material of the stressor regions 120 after the stressor regions 120 are grown. As an example, the semiconductor material of the stressor regions 120 may be grown without the dopants, and an introduction process such as an implantation process or diffusion process is utilized to introduce the dopants into the stressor regions 120. Once the dopants have been introduced into the stressor regions 120, an anneal process may be performed to activate the dopants. Similar to the in situ process described above, the n-type dopants may be phosphorus, arsenic, or the like, and the p-type dopants may be boron, $BF_2$, or the like.

Atoms and/or molecules from one or more precursors of the epitaxial growth process used to form the stressor regions 120 may react with spacers of the gate stack 100. As an example, due to the over-etching or removal of the second spacer 116 to the right of the gate stack 100, atoms and/or molecules from one or more of the precursors of the epitaxial growth process used to form the stressor regions 120 may react with the exposed offset spacer 114. Such a reaction could result in the formation of residues 122 on the exposed surface of the offset spacer 114. The residues 122 leads to defects, e.g., selectivity loss defects, on the spacers of the gate stack 100 that are difficult to remove by typical cleaning processes. Selectivity loss defects are especially pronounced in embodiments where the thickness T1 of the second spacer 116 is below that which can be resolved lithographically, such as in the 40-nm process node, 16-nm process node, and 10-nm process node.

Figure 2:
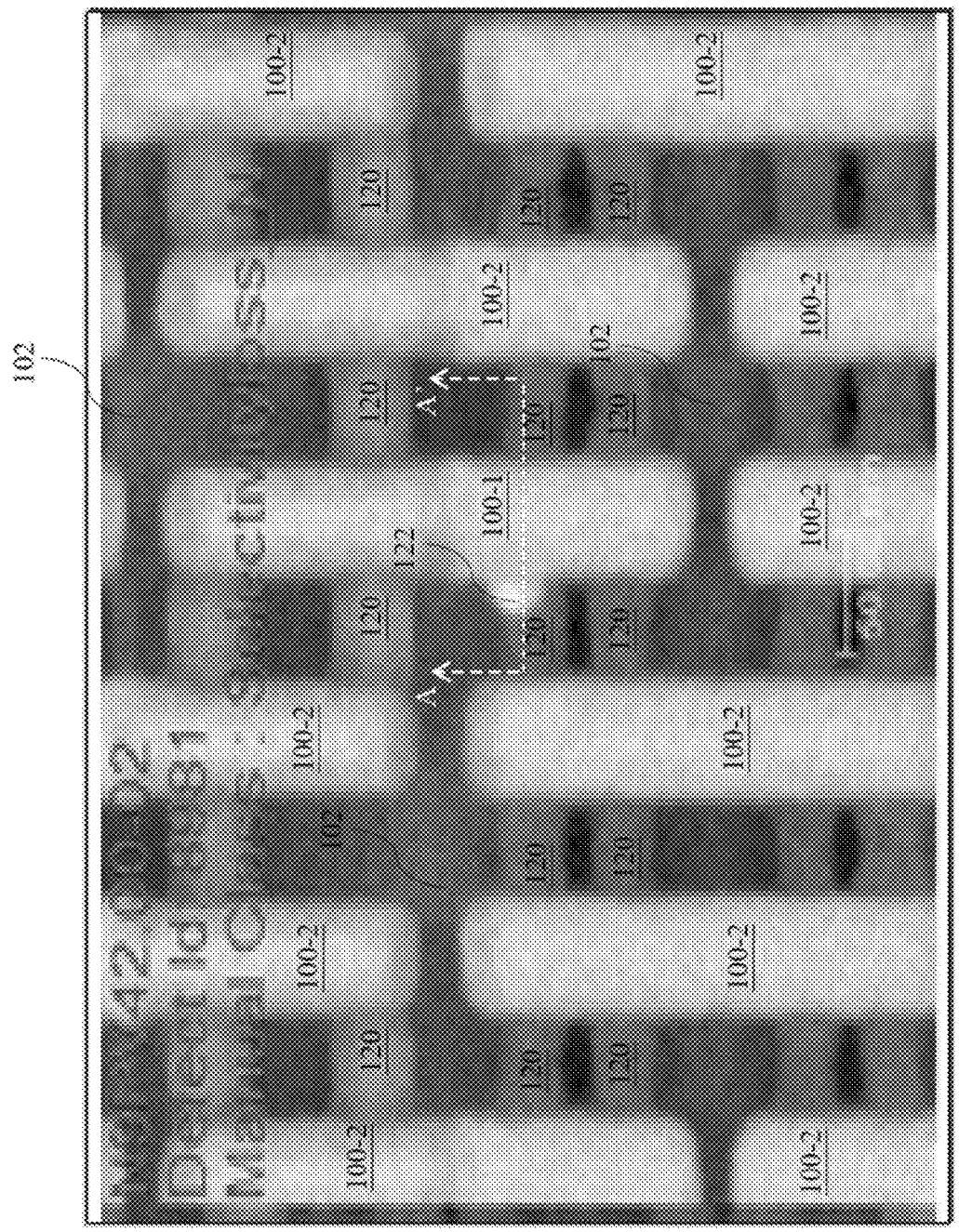
FIG. 2 shows a top-down plan view of a substrate having a plurality of gate stacks formed thereon, in accordance with an embodiment.

FIG. 2 shows a top-down plan view of the substrate 102 having a plurality of gate stacks 100 formed thereon, in accordance with one or more embodiments. The cross-sectional view shown in FIG. 1F may, as an example, be taken along a line A-A' shown in FIG. 2. As shown in FIG. 2, residues 122 may be formed adjacent to a first gate stack 100-1 at some location of the substrate 102, while other gate stacks 100-2 at other locations of the substrate 102 are free from such residues 122. As described above in relation to FIGS. 1E and 1F, this may stem from local variations in the etch rate of the one or more etching processes used to form the recesses 118 may result in removal of the second spacer 116 such that residues 122 are formed on exposed surfaces of the offset spacer 114.

Selectivity loss defects can be detrimental to device performance and thus, need to be detected. Detection of these selectivity loss defects may include the step of inspecting the substrate 102 after the stressor regions 120 are formed, e.g. using a patterned-wafer defect inspection system. The step of inspecting the substrate 102 may result in physical damage of the substrate 102, even when no such selectivity loss defects are present. If these selectivity loss defects are detected during the inspection of the substrate 102, a batch of semiconductor devices manufactured may need to be rejected. Furthermore, the reaction chamber within which the defective batch of semiconductor devices was manufactured may need to be placed offline so as to allow tool recalibration and testing. These steps of recalibration and testing may minimize or eliminate local variations in the etch rate of the one or more etching processes used to form the recesses 118. However, these steps can take about one week to about 30 days to complete, which may translate to decreased manufacturing throughput and loss of revenue do to equipment downtime. Consequently, a method for detecting these selectivity loss defects more quickly and precisely may be needed. This method may also need to be such that substantially no physical damage is made to the substrate 102.

FIGS. 3A to 3D show cross-sectional views of a method of manufacturing a wafer 302, which can be used to detect selectivity loss defects caused in an inline manufacturing process, in accordance with one or more embodiments. FIGS. 4A to 4D show top-down plan views of a method of manufacturing the wafer 302, in accordance with one or more embodiments. The cross-sectional views in FIGS. 3A to 3D may, as an example, be taken along a line D-D' shown in FIGS. 4A to 4D. Furthermore, the top-down plan views in FIGS. 4A to 4D may, as an example, be taken along a line C-C' shown in FIGS. 3A to 3D.

FIGS. 3A and 4A show the wafer 302, which may comprise similar materials as described above in respect of the substrate 102. However, the wafer 302 and the substrate 102 are separate structures. Furthermore, the substrate 102 may be used in the inline manufacturing process illustrated in FIGS. 1A to 1F, while the wafer 302 may be used to detect the presence and the locations of the residues 122 formed over the substrate 102 during the inline manufacturing process.

A dielectric layer 304 may be formed over the wafer 302, as shown in FIG. 3A. The dielectric layer 304 may comprise similar materials as the second spacers 116. For example, the dielectric layer 304 may comprise a nitride-containing material. Examples of such materials include silicon oxynitride (SiON), silicon nitride (SiN), or carbon-doped silicon nitride (SiCN). The dielectric layer 304 may be formed using one or more of the processes described above in relation to the second spacers 116, and may be formed to have the thickness T1, which may be in a range from about 3 nanometers to about 50 nanometers (e.g. about 5 nanometers). A photoresist layer 306 may be formed over the dielectric layer 304, as shown in FIG. 3A. The photoresist layer 306 may comprise one or more suitable photosensitive materials and may be deposited over the dielectric layer 304 using spin-on coating, CVD, PECVD, atomic layer deposition (ALD), or the like. In some embodiments, the photoresist layer 306 may be a tri-layer photoresist layer.

Figure 3B:
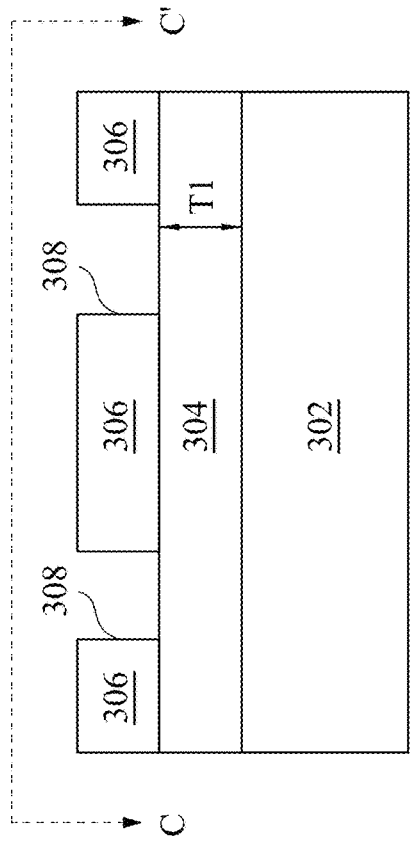
Figure 4B:
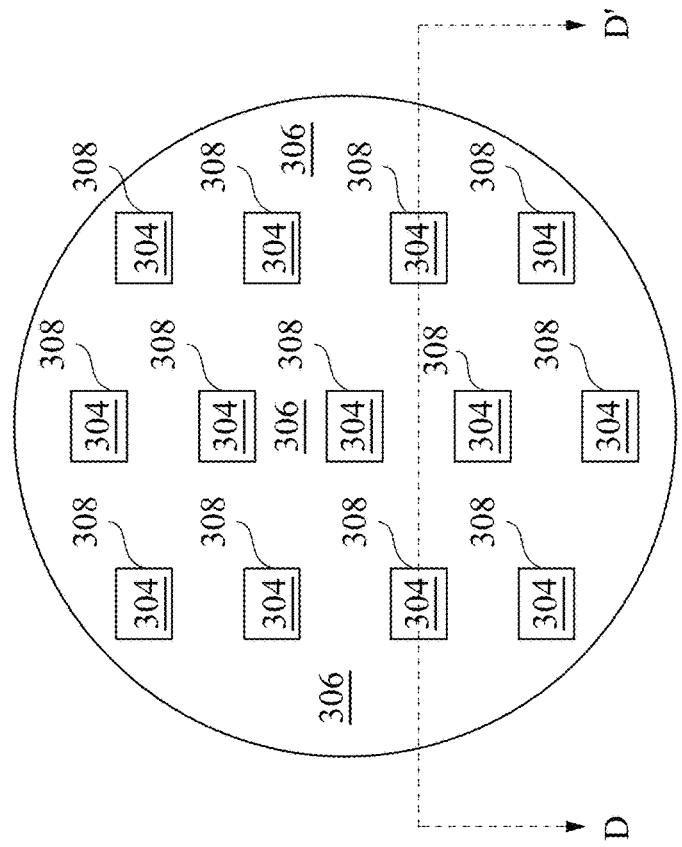

Referring to FIGS. 3B and 4B, a plurality of first openings 308 may be formed in the photoresist layer 306, e.g. in order to expose the underlying dielectric layer 304. The plurality of first openings 308 may be formed using, for example, a lithographic process (e.g. a photo-lithographic process). The plurality of first openings 308 may be formed such that an open ratio in a range from about 7 percent to about 28 percent is achieved. In other words, the plurality of first openings 308 may be formed in about 7 percent to about 28 percent of the photoresist layer 306. Furthermore, the location of each of the plurality of first openings 308 may correspond to the locations of the substrate 102 in which the recesses 118 are formed. Consequently, there may be a one-to-one correspondence between the locations of the plurality of first openings 308 in the photoresist layer 306 and the locations of the recesses 118 in the substrate 102.

Figure 3C:
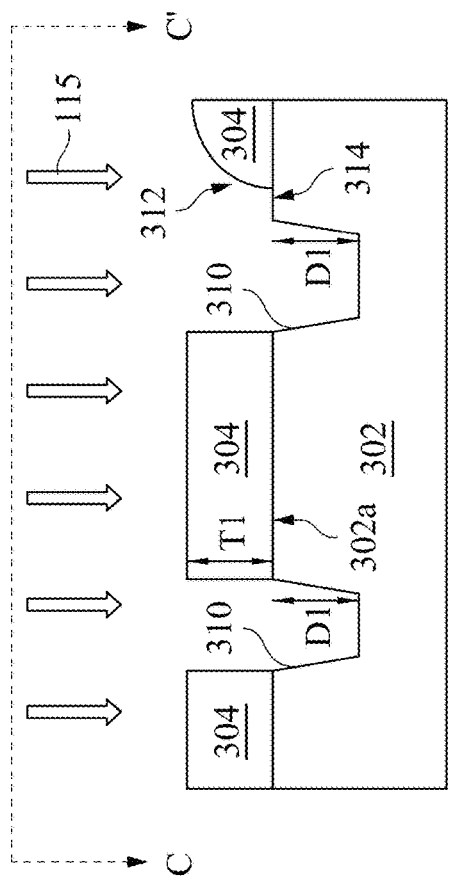
Figure 4C:
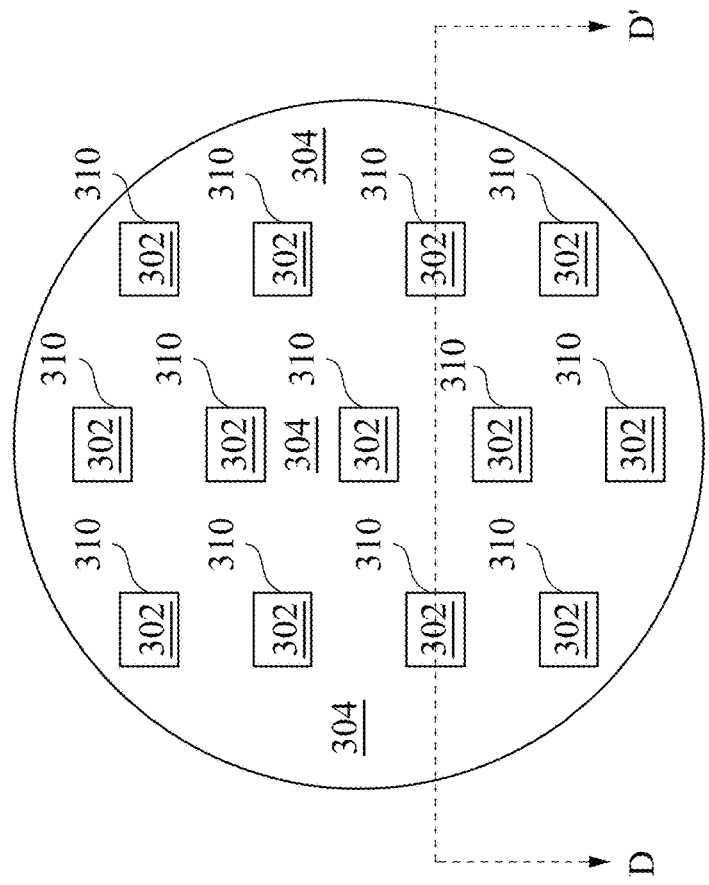

Referring to FIGS. 3C and 4C, the dielectric layer 304 and the wafer 302 may be patterned using the photoresist layer 306 as a mask. In other words, the pattern of the photoresist layer 306 may be transferred to the dielectric layer 304 and the wafer 302. The one or more of the etching processes 115 used to form the recess 118 in the substrate 102 (e.g. as described above in relation to FIG. 1E) may be used to pattern the dielectric layer 304 and the wafer 302. The one or more etching processes 115 may form a plurality of second openings 310 in the wafer 302. The plurality of second openings 310 may have a depth D1, which may be in a range from about 90 nanometers to about 150 nanometers. The location of each of the plurality of second openings 310 may correspond to the locations of the substrate 102 in which the recesses 118 are formed. Consequently, there may be a one-to-one correspondence between the locations of the plurality of second openings 310 in the wafer 302 and the locations of the recesses 118 in the substrate 102. This one-to-one correspondence between the locations of the plurality of second openings 310 in the wafer 302 and the locations of the recesses 118 in the substrate 102 may be useful in determining the location of the residues 122 formed over the substrate 102 during the inline manufacturing process illustrated in FIGS. 1A to 1F.

Since the one or more of the etching processes 115 used to form the recess 118 in the substrate 102 (e.g. as described above in relation to FIG. 1E) may also be used to pattern the dielectric layer 304 and the wafer 302, local variations in the etch rate of the one or more etching processes 115 may exist during the patterning of the dielectric layer 304 and the wafer 302. For example, as shown in FIG. 3C, local variations in the etch rate of the one or more etching processes 115 may cause some portions 312 of the dielectric layer 304 to be over-etched compared to other portions of the dielectric layer 304. This may result in the exposure of a portion 314 of a major surface 302a of the wafer 302. Following the formation of the plurality of second openings 310, the photoresist layer 306 may be removed using, for example, a stripping process (e.g. a wet strip process) or an ashing process (e.g. plasma ashing process).

Figure 3D:
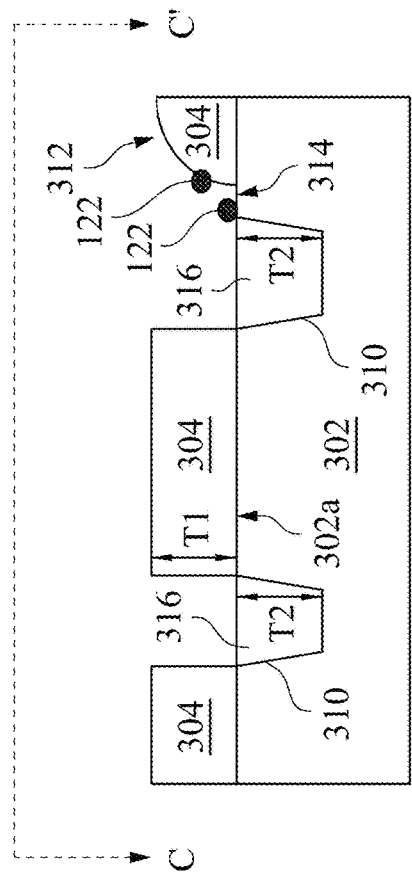
Figure 4D:
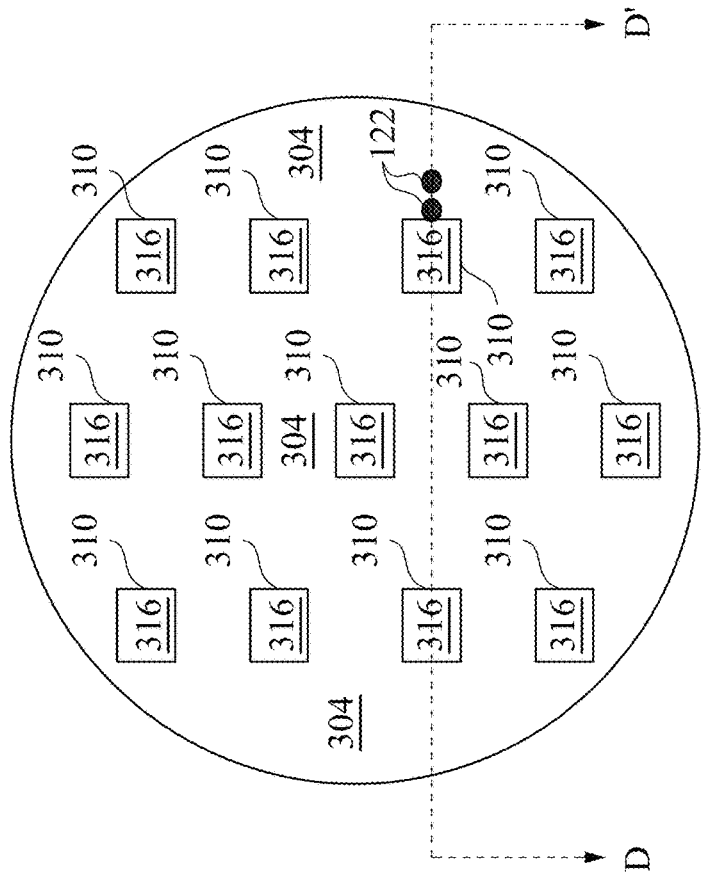

Referring to FIG. 4D, a semiconductor material 316 may be formed in the plurality of second openings 310. The semiconductor material 316 may be formed using an epitaxial growth process similar to the one or more processes described above in respect of the stressor regions 120. In some embodiments, the semiconductor material 316 may be formed to have a thickness T2, which may be in a range from about 30 nanometers to about 70 nanometers. In some embodiments, a ratio of the thickness T2 of the semiconductor material 316 to the depth D1 of the plurality of second openings 310 may be in a range from about 0.2 to about 1. As shown in the examples of FIGS. 3D and 4D, as a result of the portion 314 of the major surface 302a of the wafer 302 being exposed, atoms and/or molecules from the precursor of the epitaxial growth process used to form the semiconductor material 316 may react with the exposed portion 314 of the major surface 302a of the wafer 302. Such a reaction could result in the formation of residues 122 on the exposed portion 314 of the major surface 302a of the wafer 302, thereby leading defects, e.g., selectivity loss defects, being formed over the wafer 302. In some embodiments, as in the example of FIG. 3D, residues 122 may also be formed on the over-etched portion 312 of the dielectric layer 304.

Following this, the wafer 302 may be subjected to wavelength-dispersive X-ray spectroscopy (WDS) measurement, which may be a method for counting the number of X-rays of a specific wavelength diffracted by a material. The WDS measurement may be performed on each of the plurality of second openings 310 having the semiconductor material 316 formed therein. In addition, electrical current-voltage (IV) measurements may be performed on each of the plurality of second openings 310 having the semiconductor material 316 formed therein. The WDS and IV measurements can be used to detect the presence and the location of the residues 122 formed over the wafer 302. For example, the residues 122 formed over the wafer 302 may be located adjacent to the one or more of the plurality of second openings 310. Since there may be one-to-one correspondence between the locations of the plurality of second openings 310 in the wafer 302 and the locations of the recesses 118 in the substrate 102, the WDS and IV measurements performed on the wafer 302 may be used to infer or determine the location of the residues 122 formed over the substrate 102 during the inline manufacturing process illustrated in FIGS. 1A to 1F.

Figure 5:
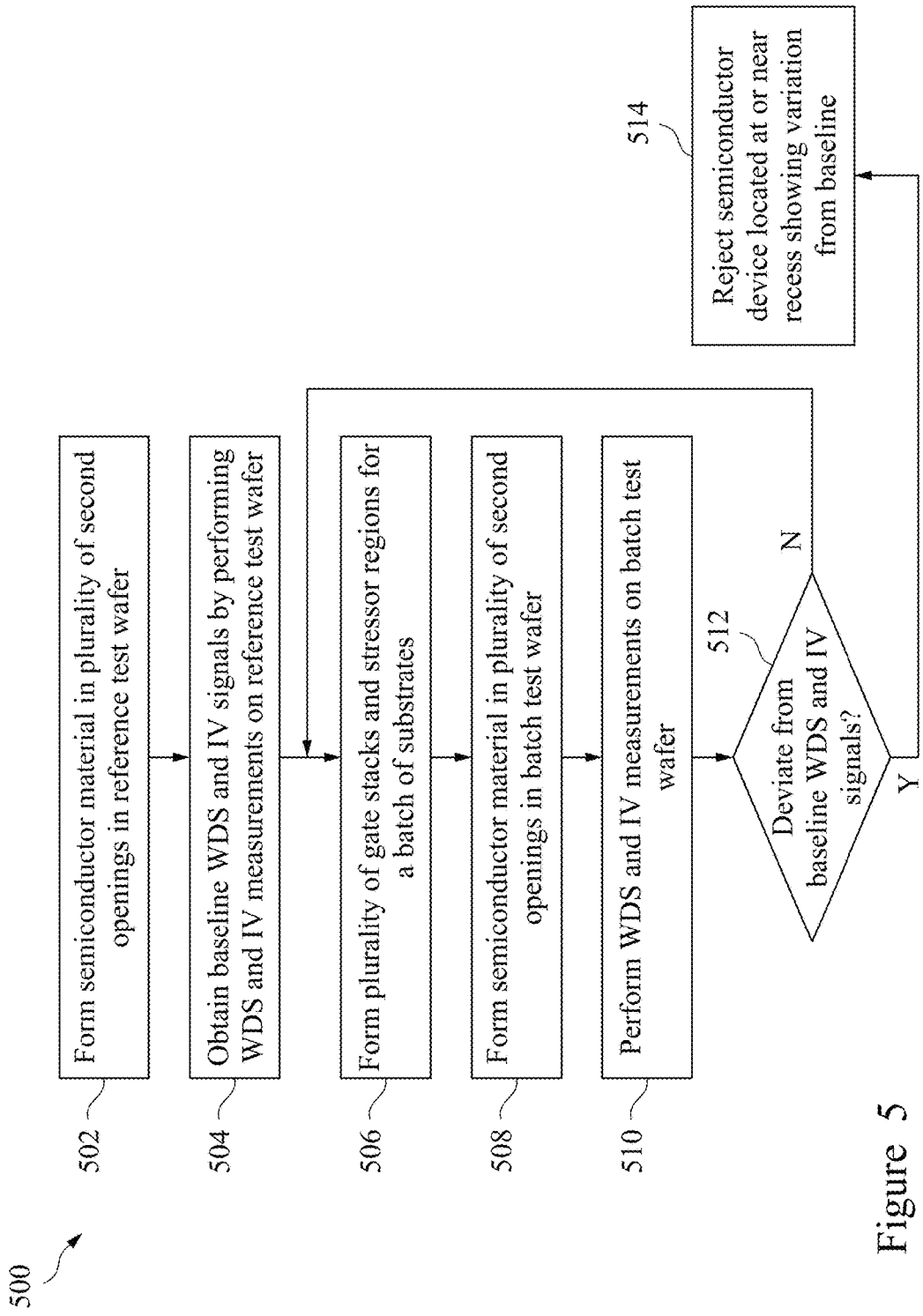
FIG. 5 shows a flow diagram illustrating a method of using a wafer to detect the presence and the location of selectivity loss defects, in accordance with an embodiment.
Figure 6:
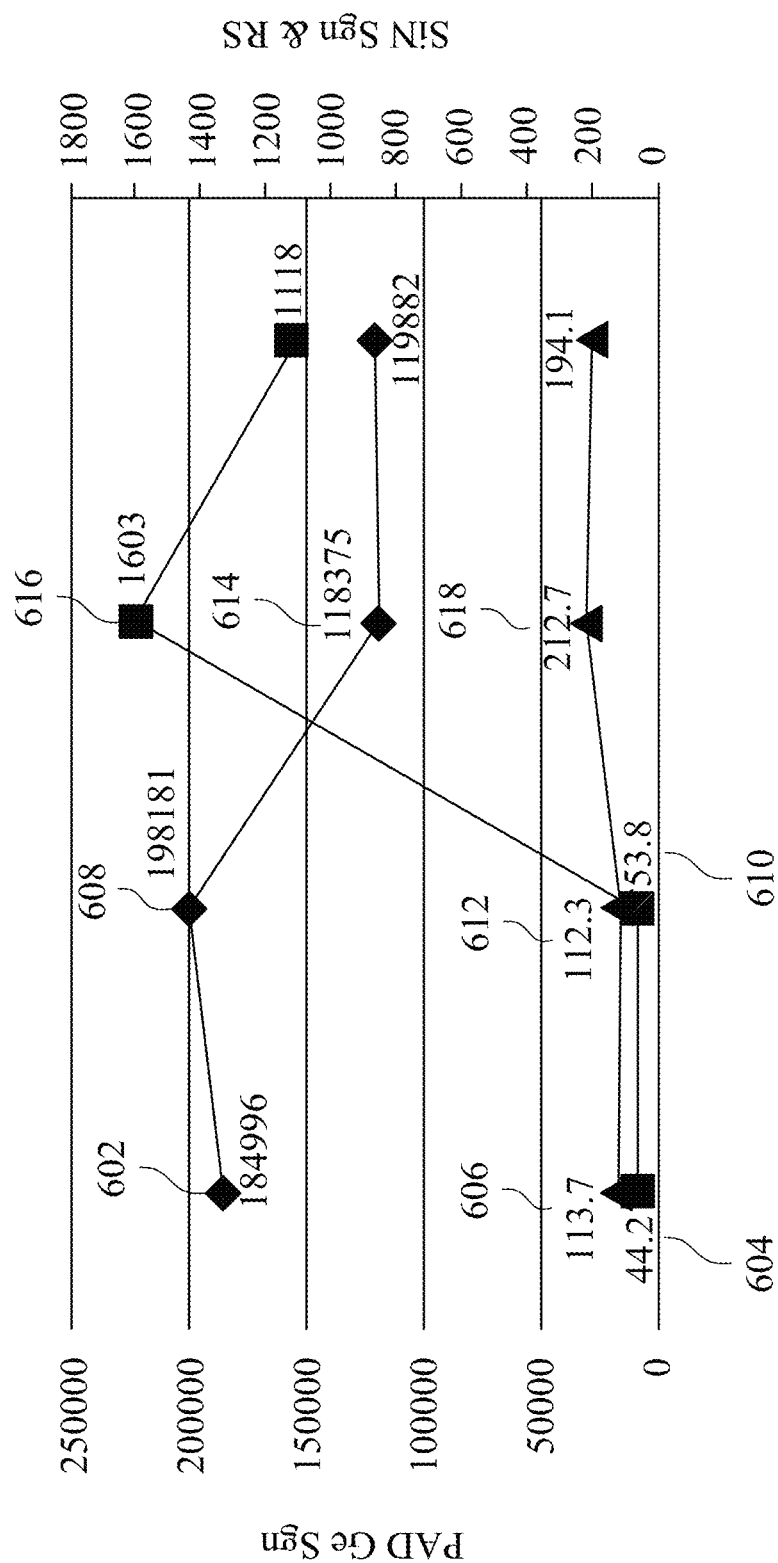
FIG. 6 shows variations in wavelength-dispersive X-ray spectroscopy (WDS) measurements and current-voltage measurements, in accordance with an embodiment.

FIG. 5 shows a flow diagram illustrating a method of using the wafer 302 to detect the presence and the location of selectivity loss defects that may be caused by the residues 122 formed on the offset spacer 144 shown in FIG. 1F. The flow diagram 500 begins with step 502, where the semiconductor material 316 is formed in the plurality of second openings 310 in a reference wafer 302 (e.g. using the process described above in relation to FIGS. 3A to 3D and 4A to 4D). Following this, in step 504, WDS and IV signals are obtained by performing WDS and IV measurements on each of the plurality of second openings 310 having the semiconductor material 316 formed therein. In so doing, baseline WDS and IV signals are established for each of the plurality of second openings 310 having the semiconductor material 316 formed therein. As an example, FIG. 6 shows the baseline WDS signal 602 for the semiconductor material 316 in a given opening of the plurality of second openings 310. In addition, the dielectric layer 304 for the given opening of the plurality of second openings 310 has a baseline WDS signal 604, while the IV signal for the semiconductor material 316 in the given opening of the plurality of second openings 310 has a baseline IV signal 606.

Referring to step 506, the flow diagram 500 continues with the formation of the plurality of gate stacks 100 and the stressor regions 120 for a batch of substrates 102. In other words, a plurality of semiconductor devices may be manufactured for a plurality of substrate 102 using the process flow described above in respect of FIGS. 1A to 1F. During the manufacturing of a specified batch of semiconductor devices, there may be local variations in the etch rate of the one or more etching processes 115 used to form the stressor regions 120, which may result from a drift in instrument calibration over time. To check whether such local variations in the etch rate have occurred during the manufacturing of the specified batch of semiconductor devices, a batch wafer 302 is manufactured (e.g. in step 508) according to the process flow described above in relation to FIGS. 3A to 3D and 4A to 4D. Each of the plurality of second openings 310 having the semiconductor material 316 formed in the batch wafer 302 is then subjected to the WDS and IV measurements (e.g. in step 510). Since there may be a one-to-one correspondence between the locations of the plurality of second openings 310 in the batch wafer 302 and the locations of the recesses 118 in the batch of substrates 102, any changes in the WDS and IV measurements relative to the baseline WDS and IV signals may serve as an indication of the presence and the position of any residues 122 formed over the substrate 102 during the inline manufacturing process of the specified batch of semiconductor devices.

As shown in FIG. 6, the batch WDS signals 608 and 610 for the semiconductor material 316 and the dielectric layer 304 for the given opening of the plurality of second openings 310 of the batch wafer 302 are substantially similar to the baseline WDS signals 602 and 604, respectively. Similarly, the batch IV signal 612 is substantially similar to the baseline IV signal 606. This may serve as an indication that no variations in the etch rate have occurred near a recess 118 that corresponds in location to the given opening, and thus, no residues 122 are present near the recess 118 in the specified batch of semiconductor devices.

As a result, the inline manufacturing process may proceed to step 506 shown in FIG. 5 where another batch of semiconductor devices is manufactured over another batch of substrates 102. During the manufacturing of this batch of semiconductor devices, there may be local variations in the etch rate of the one or more etching processes used to form the stressor regions 120, which may be a result of a drift in instrument calibration over time. To check whether such local variations in the etch rate have occurred during the manufacturing of this batch of semiconductor devices, another batch wafer 302 is manufactured (e.g. in step 508) according to the process flow described above in relation to FIGS. 3A to 3D and 4A to 4D. Each of the plurality of second openings 310 having the semiconductor material 316 formed in the batch wafer 302 is then subjected to the WDS and IV measurements (e.g. in step 510). Since there may be a one-to-one correspondence between the locations of the plurality of second openings 310 in the batch wafer 302 and the locations of the recesses 118 in the batch of substrates 102, any changes in the WDS and IV measurements relative to the baseline WDS and IV signals may serve as an indication of the presence and the position of any residues 122 formed over the substrate 102 during the inline manufacturing process.

As shown in FIG. 6, the batch WDS signals 614 and 616 for the semiconductor material 316 and the dielectric layer 304 are different from the baseline WDS signals 602 and 604, respectively. Similarly, the batch IV signal 618 is also different from the baseline IV signal 606. This may serve as an indication that variations in the etch rate have occurred at the recess 118 that corresponds in location to the given opening, and thus, no residues 122 are present near the recess 118 in the specified batch of semiconductor devices. Since there may be a one-to-one correspondence between the locations of the plurality of second openings 310 in the batch wafer 302 and the locations of the recesses 118 in the batch of substrates 102, and since such WDS and IV signals are generated for each of the plurality of second openings 310, the precise location of these defects can be determined. Accordingly, as shown in step 514 of FIG. 5, the semiconductor devices located near recesses 118 that correspond to locations where these variations from baseline are observed may be rejected, while other semiconductor devices located near the recesses 118 that correspond to locations having substantially no variations from baseline may be kept for further processing.

As a result, a simplified method for checking the presence and locations of defects may be provided. Furthermore, the flow diagram shown in FIG. 5 allows for the early detection of defects, thereby reducing cycle times. As an example, less than one day may be needed to generate the WDS and IV measurements and to determine locations where the defects are present. Since specific semiconductor devices located near recesses 118 that correspond to locations where these variations from baseline are observed may be rejected (rather than rejecting the whole batch), the flow diagram shown in FIG. 5 allows for cost savings by minimizing waste. Furthermore, the WDS and IV measurements are performed on the wafer 302, thus no damage is made to the substrate 102 used to manufacture the semiconductor devices.

According to one or more embodiments described herein, a method may include: forming a dielectric layer over a wafer; forming a plurality of openings extending through the dielectric layer and into the wafer; epitaxially forming a semiconductor material within the plurality of openings; performing one or more measurements for each of the plurality of openings having the semiconductor material formed therein; and determining a presence of a defect over a substrate based on the one or more measurements.

According to one or more embodiments described herein, a method may include: forming a semiconductor material in a plurality of openings in a reference wafer using an epitaxial growth process; performing one or more measurements on the reference wafer to obtain a baseline signal; forming a plurality of gate stacks and stressor regions in a plurality of substrates; after forming the plurality of gate stacks, forming the semiconductor material in a plurality of openings in a batch wafer; performing the one or more measurements on the batch wafer to obtain a batch signal; comparing the batch signal to the baseline signal; and determining whether a defect in present in the plurality of substrates based on the comparison.

According to one or more embodiments described herein, a wafer may include: a dielectric layer disposed over a first semiconductor substrate; a plurality of openings extending through the dielectric layer and into the first semiconductor substrate; and a compound semiconductor material disposed within each of the plurality of openings, wherein there is a one-to-one correspondence between locations of the plurality of opening and locations of recesses in a second semiconductor substrate used in a manufacturing process of a semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a dielectric layer over a wafer;
   forming a plurality of openings extending through the dielectric layer and into the wafer;
   epitaxially forming a semiconductor material within the plurality of openings;
   performing one or more measurements for each of the plurality of openings having the semiconductor material formed therein; and
   determining a presence of a defect over a substrate based on the one or more measurements.

2. The method of claim 1, wherein the one or more measurements comprises a wavelength-dispersive X-ray spectroscopy measurement.

3. The method of claim 1, wherein the epitaxially forming the semiconductor material comprises at least one of molecular beam epitaxy, liquid phase epitaxy, vapor phase epitaxy, or selective epitaxial growth.

4. The method of claim 1, wherein the forming the dielectric layer over the wafer comprises at least one of a chemical vapor deposition, a plasma enhanced chemical vapor deposition, a low-pressure chemical vapor deposition, or a sub-atmospheric chemical vapor deposition.

5. The method of claim 1, wherein a thickness of the dielectric layer is in a range from about 3 nanometers to about 50 nanometers.

6. The method of claim 1, wherein the plurality of openings is formed in a range from about 7 percent to about 28 percent of the wafer.

7. The method of claim 1, wherein each of the plurality of openings have a depth in a range from about 90 nanometers to about 150 nanometers.

8. The method of claim 1, wherein a ratio of a thickness of the semiconductor material to a depth of the plurality of openings is in a range from about 0.2 to about 1.

9. A method, comprising:
   forming a semiconductor material in a plurality of openings in a reference wafer using an epitaxial growth process;
   performing one or more measurements on the reference wafer to obtain a baseline signal;
   forming a plurality of gate stacks and stressor regions in a plurality of substrates;
   after forming the plurality of gate stacks, forming the semiconductor material in a plurality of openings in a batch wafer;
   performing the one or more measurements on the batch wafer to obtain a batch signal;
   comparing the batch signal to the baseline signal; and
   determining whether a defect is present over the plurality of substrates based on the comparison.

10. The method of claim 9, wherein the defect comprises a selectivity loss defect.

11. The method of claim 9, wherein the stressor regions are formed by the epitaxial growth process, and wherein the defect comprises a residue disposed over spacers of the plurality of gate stacks, the residue formed by a reaction between a precursor of the epitaxial growth process and one or more of the spacers of the plurality of gate stacks.

12. The method of claim 9, wherein there is a one-to-one correspondence between locations of the plurality of openings in the batch wafer and locations of the stressor regions in the plurality of substrates.

13. The method of claim 9, wherein the one or more measurements comprises a wavelength-dispersive X-ray spectroscopy measurement.

14. The method of claim 9, wherein the stressor regions are disposed in recesses formed by one or more etching processes, and wherein the one or more etching processes are used to form the plurality of openings in the reference wafer and the plurality of openings in the batch wafer.

15. The method of claim 9, wherein the defect is determined to be present when the batch signal is different from the baseline signal.

16. The method of claim 9, wherein the defect is determined to be absent when the batch signal is substantially equal to the baseline signal.

17. A method, comprising:
on a control wafer, forming a control dielectric material, the control dielectric material corresponding to a dielectric material used to form a spacer on a production wafer;
patterning the control dielectric material to form a control pattern of recesses, the control pattern corresponding to a pattern of recesses to be formed in the dielectric material on the production wafer;
filling the recesses of the control pattern of recesses with a control epitaxial material, the control epitaxial material corresponding to an epitaxial material to be grown in the recesses of the pattern of recesses to be formed in the dielectric material on the production wafer;
forming the dielectric material on the production wafer;
patterning the dielectric material with the pattern of recesses;
filling recesses of the pattern of recesses with the epitaxial material;
testing the control wafer for the presence of defect conditions at the recesses of the control pattern recesses; and
in response to detecting a defect condition at a particular recess of the control pattern of recesses, identifying a location on the production wafer corresponding to the particular recess of the control pattern of recesses and marking a device at the identified location as defective.

18. The method of claim 17, wherein patterning the dielectric material with the pattern includes forming sidewall spacers on respective gate electrodes formed on the production wafer.

19. The method of claim 17, wherein testing the control wafer for the presence of defect conditions includes a wavelength-dispersive X-ray spectroscopy (WDS) measurement.

20. The method of claim 19, wherein testing the control wafer for the presence of defect conditions further includes electrical current-voltage measurements.

* * * * *